(12) United States Patent
Tsai et al.

(10) Patent No.: US 11,088,080 B2
(45) Date of Patent: Aug. 10, 2021

(54) CHIP PACKAGE STRUCTURE USING SILICON INTERPOSER AS INTERCONNECTION BRIDGE

(71) Applicant: POWERTECH TECHNOLOGY INC., Hsinchu County (TW)

(72) Inventors: Pei-Chun Tsai, Hsinchu County (TW); Hung-Hsin Hsu, Hsinchu County (TW); Shang-Yu Chang Chien, Hsinchu County (TW); Nan-Chun Lin, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 14 days.

(21) Appl. No.: 16/679,326

(22) Filed: Nov. 11, 2019

(65) Prior Publication Data

US 2021/0074645 A1 Mar. 11, 2021

(30) Foreign Application Priority Data

Sep. 5, 2019 (TW) ................. 108132054

(51) Int. Cl.
*H01L 23/538* (2006.01)
*H01L 23/498* (2006.01)
*H01L 23/31* (2006.01)
*H01L 23/00* (2006.01)

(52) U.S. Cl.
CPC ...... *H01L 23/5385* (2013.01); *H01L 23/3114* (2013.01); *H01L 23/49872* (2013.01); *H01L 24/05* (2013.01); *H01L 24/45* (2013.01); *H01L 2224/02379* (2013.01); *H01L 2224/45147* (2013.01)

(58) Field of Classification Search
CPC ....... H01L 2224/13147; H01L 2224/18; H01L 21/565; H01L 23/3121; H01L 24/24; H01L 2924/00014; H01L 23/5385; H01L 23/5381; H01L 23/3114; H01L 2224/02379

See application file for complete search history.

(56) References Cited

U.S. PATENT DOCUMENTS

| 9,368,450 | B1 | 6/2016 | Gu |
| 9,997,446 | B2 | 6/2018 | Kim |
| 2015/0001717 | A1 | 1/2015 | Karhade |
| 2015/0171015 | A1 | 6/2015 | Mahajan |

(Continued)

FOREIGN PATENT DOCUMENTS

| CN | 104253115 B | 9/2018 |
| CN | 104733436 B | 1/2019 |

(Continued)

*Primary Examiner* — Jasmine J Clark
(74) *Attorney, Agent, or Firm* — Winston Hsu

(57) ABSTRACT

A chip package structure using silicon interposer as interconnection bridge lifts multi-dies above the fan-out molding package embedded with premade Si interposer interconnection bridge under the multi-die space. The interconnection bridge connects the multi-dies through fine pitch high I/O interconnection. A first RDL and a second RDL are further disposed on top side and bottom side of the fan-out molding package, further providing connection for the multi-dies to a substrate via the connection routing inside the fan-out molding package.

10 Claims, 4 Drawing Sheets

(56) References Cited

U.S. PATENT DOCUMENTS

| | | | |
|---|---|---|---|
| 2018/0308789 A1 | 10/2018 | Zhao | |
| 2018/0358298 A1 | 12/2018 | Zhai | |
| 2019/0206791 A1 | 7/2019 | Pietambaram | |
| 2020/0058627 A1* | 2/2020 | Chen | ................... H01L 21/566 |

FOREIGN PATENT DOCUMENTS

| | | |
|---|---|---|
| TW | I483369 B | 5/2015 |
| TW | I600114 B | 9/2017 |

* cited by examiner

CHIP PACKAGE STRUCTURE USING SILICON INTERPOSER AS INTERCONNECTION BRIDGE

BACKGROUND OF THE INVENTION

1. Field of the Invention

The invention relates to a package structure, and more particularly, to a chip package structure using silicon interposer as interconnection bridge.

2. Description of the Prior Art

High level chips have been in increasing demand for product requirements like small size, high I/O count, high thermo performance, and low noise. Back-end processes such as packaging also follow the direction towards reducing the overall package size or integrating more functions in the same chip area and increase the I/O count. It is certainly a trendy development of IC to integrate two or more chips in one package known as multi-die packaging.

Modern technology of multi-die packaging packages two or more than two chips in one chip package by integration (horizontal placement) and/or stacking. As for the horizontal placement integration, conventional interconnection between chips is realized by the bottom substrate and redistribution layers (RDL), which have limitations on width/pitch ratio due to the manufacturing capability, thereby setting up the barrier to integration of multi-die structure. Inter-chip connection hence becomes costly and less efficient, for longer routes or more RDLs are needed. It is obvious that longer routes and/or more RDLs mean degeneration of SNR and performance of power consumption.

SUMMARY OF THE INVENTION

Therefore, the embodiments of the invention provide a chip package structure using silicon interposer as interconnection bridge to solve the above-mentioned problem.

According to an embodiment of the invention, a chip package structure using silicon interposer as interconnection bridge includes a fan-out package, a first semiconductor die, and a second semiconductor die. The fan-out package includes an interconnection bridge, a first connection wiring, and a second connection wiring. The interconnection bridge is embedded and packaged in a molding layer. The fan-out package has a bottom surface and a top surface opposite with each other. The first semiconductor die and the second semiconductor die are disposed and adjacent to each other on the top surface of the fan-out package. The first semiconductor die includes a plurality of first contacts and a plurality of second contacts, and the second semiconductor die includes a plurality of third contacts and a plurality of fourth contacts. The interconnection bridge is disposed correspondingly under the plurality of first contacts of the first semiconductor die and the plurality of third contacts of the second semiconductor die where the plurality of first contacts form inter-chip connection with the plurality of third contacts through the interconnection bridge. The fan-out package is disposed on the substrate via the bottom surface, and the plurality of second contacts and the plurality of fourth contacts are electrically connected to the substrate respectively through the first connection wiring and the second connection wiring.

According to the embodiment of the invention, the chip package structure further includes a first redistribution layer disposed on the top surface of the fan-out package. The first semiconductor die and the second semiconductor die are disposed on the first redistribution layer, and the plurality of second contacts and the plurality of fourth contacts are respectively connected to the first connection wiring and the second connection wiring through the first redistribution layer.

According to the embodiment of the invention, the chip package structure further includes a second redistribution layer disposed between the bottom surface of the fan-out package and the substrate. The second redistribution layer includes a plurality of contact pads. The plurality of second contacts and the plurality of fourth contacts are electrically connected to the substrate through the plurality of contact pads and respectively through the first connection wiring and the second connection wiring.

According to the embodiment of the invention, the first connection wiring and the second connection wiring are copper pillars or through molding via (TMV).

According to the embodiment of the invention, the interconnection bridge further electrically connects the substrate with at least part of the plurality of first contacts and at least part of the plurality of third contacts using through silicon via (TSV).

According to the embodiment of the invention, the interconnection bridge is a silicon interposer and is disposed partially in the molding layer, the silicon interposer is pre-made by silicon procedure before molding.

According to the embodiment of the invention, the minimum line width/line pitch ratio of the interconnection bridge is no greater than 1/1 micrometer.

According to the embodiment of the invention, the plurality of first contacts of the first semiconductor die and the plurality of third contacts of the second semiconductor die are fine pitch signal contacts. The pitch of the plurality of first contacts and the plurality of third contacts is no greater than 30 micrometers.

According to the embodiment of the invention, the plurality of second contacts of the first semiconductor die and the plurality of fourth contacts of the second semiconductor die are wide pitch power contacts or grounding contacts. The pitch of the plurality of second contacts and the plurality of fourth contacts is greater than 30 micrometers.

According to the embodiment of the invention, a protective molding layer is further disposed on the top surface of the fan-out package and covering the first semiconductor die and the second semiconductor die.

The chip package structure according to the embodiment of the invention lifts multi-dies allows easier multi-die integration or system in package (SiP) and the shortest connection route also improves the signal/consumption performance.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. In the following discussion and in the claims, the terms "include" and "comprise" are used in an open-ended fashion. Also, the term "couple" is intended to mean either an indirect or direct electrical/mechanical connection. Thus, if a first device is coupled to a second device, that connection may be through a direct electrical/mechanical connection, or through an indirect electrical/mechanical connection via other devices and connections.

Figure 1:
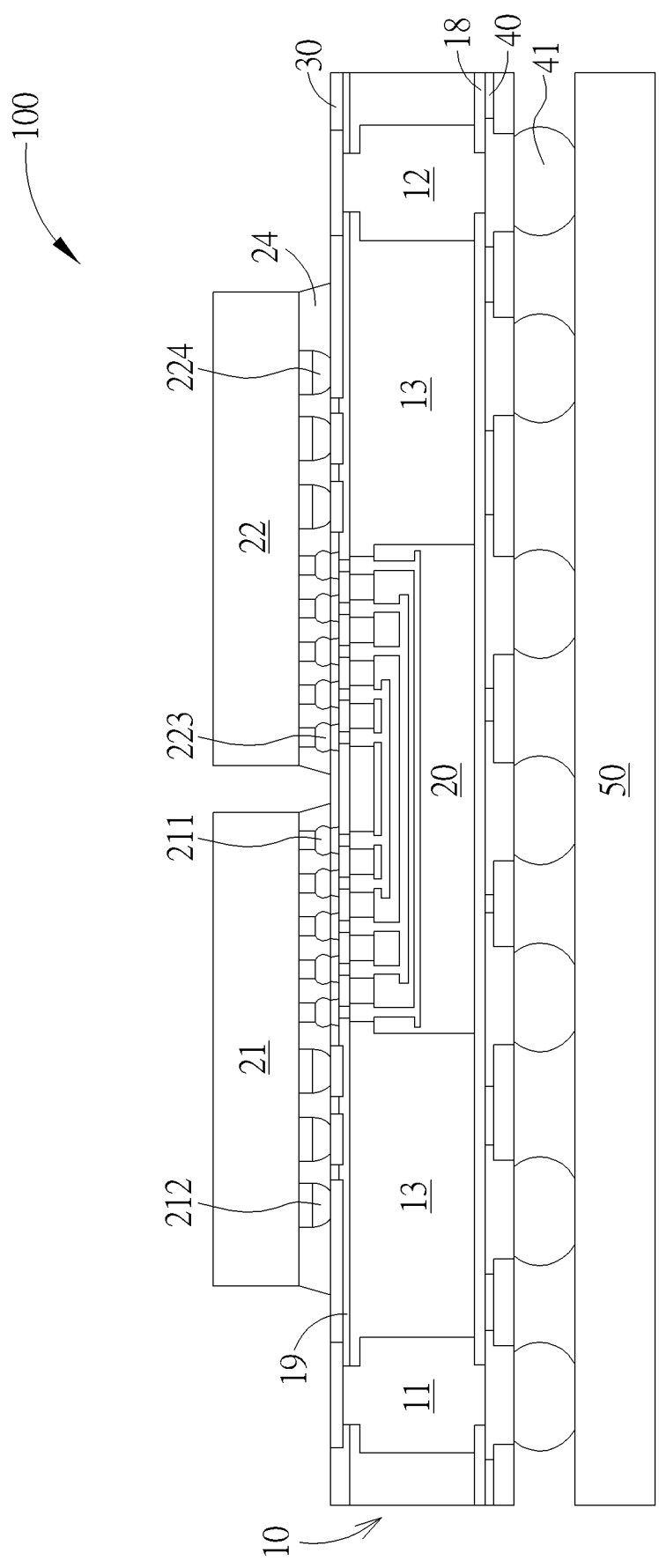
FIG. 1 is an illustration showing cross sectional view of a first embodiment of the chip package structure using silicon interposer as interconnection bridge according to the invention.

Please refer to FIG. 1. FIG. 1 is an illustration showing cross sectional view of a first embodiment of the chip package structure using silicon interposer as interconnection bridge according to the invention. The chip package structure 100 according to the embodiment lifts the semiconductor dies above the fan-out package. In the first embodiment, the chip package structure 100 includes a fan-out package 10 and at least a first semiconductor die 21 and a second semiconductor die 22. The fan-out package 10 includes an interconnection bridge 20 embedded and packaged in a molding layer 13. The fan-out package 10 also includes a bottom surface 18 and a top surface 19 opposite with each other where the semiconductor dies are disposed on the top surface 19 and further disposed on a substrate 50 with the fan-out package 10 via the bottom surface 18. The chip package structure according to the embodiment of the invention falls to the category of multi-die package structure, which integrates two or more than two dies in one package structure in horizontal placement. Besides the embodiment of FIG. 1 that the chip package structure 100 has the first semiconductor die 21 and the second semiconductor die 22, the scope of the invention also covers chip package structures having more semiconductor dies. The first semiconductor die 21 and the second semiconductor die 22 are disposed and adjacent to each other on the top surface 19 of the fan-out package 10. The first semiconductor die 21 and the second semiconductor die 22 can be hybrid bump design structure in such a way that the first semiconductor die 21 includes a plurality of first contacts 211 and a plurality of second contacts 212 and the second semiconductor die 22 includes a plurality of third contacts 223 and a plurality of fourth contacts 224. In one embodiment, the plurality of first contacts 211 of the first semiconductor die 21 and the plurality of third contacts 223 of the second semiconductor die 22 are fine pitch signal contacts where the first contacts 211 and the third contacts 223 can be used as interconnection contacts between dies and preferably, but not limited to, the pitch of the first contacts 211 and the third contacts 223 is no greater than 30 micrometers. Additionally, an underfill 24 (UF) can further be disposed beneath the first semiconductor die 21 and the second semiconductor die 22 for improving the reliability of the contacts.

The interconnection bridge 20 made by advanced procedure is used for interconnection between the first semiconductor die 21 and the second semiconductor die 22. In the first embodiment, silicon interposer with minimum line width/line pitch ratio no greater than 1/1 micrometer can be used as the interconnection bridge 20, which is disposed partially in the molding layer 13 and is pre-made by silicon procedure before molding. The interconnection bridge 20 is disposed correspondingly under the plurality of first contacts 211 of the first semiconductor die 21 and the plurality of third contacts 223 of the second semiconductor die 22 in such a way that the plurality of fine-pitched first contacts 211 forms inter-chip connection with the plurality of fine-pitched third contacts 223 through the interconnection bridge 20 following the shortest route. As described earlier, the interconnection bridge 20 using silicon interposer provides minimum line width/line pitch ratio smaller than 1/1 micrometer, and therefore high I/O connection between chips can be realized without excessive routing or redistribution. It should be noted that one interconnection bridge 20 connecting two semiconductor dies in the embodiment should not be a limitation to the invention, and two or more interconnection bridges 20 can be placed in one fan-out package 10 as interconnection bridges of two or more semiconductor dies atop.

Please keep referring to FIG. 1. The first semiconductor die 21 the second semiconductor die 22 further have wide pitch (for example greater than 30 micrometers, but not limited to) plurality of second contacts 212 and plurality of fourth contacts 224 respectively, which may be signal contacts, power contacts, or grounding contacts with wide I/O pitch. Hence, the first semiconductor die 21 and the second semiconductor die 22 come with, but not limited to, hybrid bump design. These signal contacts with larger pitch are electrically connected to the substrate 50 respectively through a first connection wiring 11 and a second connection wiring 12 of the fan-out package 10. In one embodiment, the plurality of second contacts 212 and the plurality of fourth contacts 224 are connected to the substrate 50 through the fan-out redistribution structure of the fan-out package 10.

For example, the chip package structure 100 can further include a first redistribution layer 30 and a second redistribution layer 40. The first redistribution layer 30 is disposed on the top surface 19 of the fan-out package 10, where the first semiconductor die 21 and the second semiconductor die 22 are disposed on the first redistribution layer 30. The plurality of second contacts 212 of the first semiconductor die 21 and the plurality of fourth contacts 224 of the second semiconductor die 22 are respectively connected to the first connection wiring 11 and the second connection wiring 12 through the first redistribution layer 30. The second redistribution layer 40 is disposed between the bottom surface 18 of the fan-out package 10 and the substrate 50. The second redistribution layer 40 includes a plurality of contact pads 41, whereas the plurality of second contacts 212 and the plurality of fourth contacts 224 are electrically connected to the substrate 50 through the plurality of contact pads 41 and respectively through the first connection wiring 11 and the second connection wiring 12.

Figure 2:
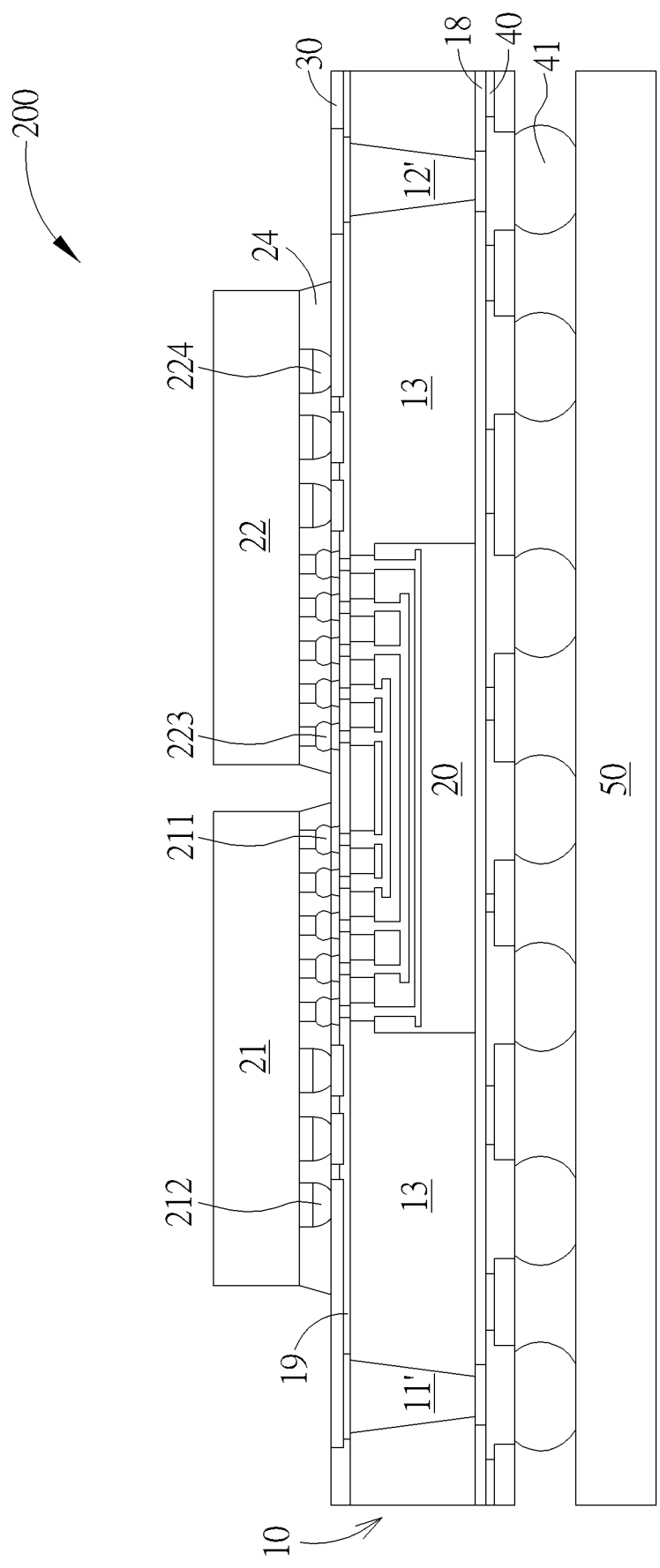
FIG. 2 is an illustration showing cross sectional view of a second embodiment of the chip package structure using silicon interposer as interconnection bridge according to the invention.

It should be noted that in the first embodiment, the first connection wiring 11 and the second connection wiring 12 can be copper pillar structure. In addition to the signal channel between the first redistribution layer 30 and the second redistribution layer 40, in other embodiments, one or more upper chip package structures can stack atop the chip package structure 100, and the top chip package structure(s) is connected to the substrate 50 through the first connection wiring 11 and the second connection wiring 12 and through the contact pads 41 of the second redistribution layer 40. For the second embodiment in FIG. 2, the first connection wiring 11' and the second connection wiring 12' can also be through mold via (TMV) structure.

Figure 3:
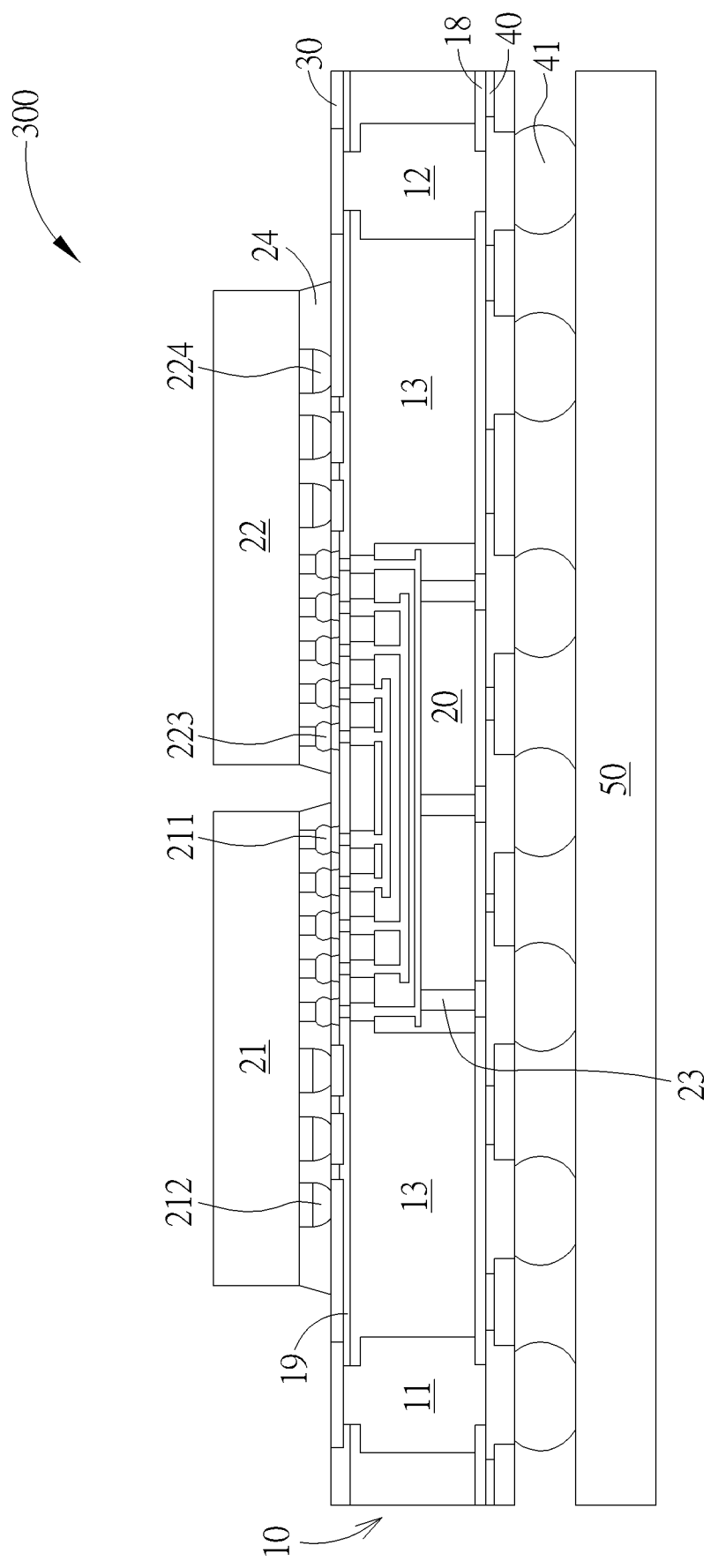
FIG. 3 is an illustration showing cross sectional view of a third embodiment of the chip package structure using silicon interposer as interconnection bridge according to the invention.

Please refer to FIG. 3. The chip package structure 300 in a third embodiment in FIG. 3 has substantially the same structure as the chip package structure 100 in FIG. 1, in which same component is designated with the same number. The interconnection bridge 20 of the third embodiment further electrically connects the substrate 50 using through silicon via (TSV). In other words, given the design need of package structure, at least part of the plurality of first contacts 211 of the first semiconductor die 21 and/or at least part of the plurality of third contacts 223 of the second semiconductor die 22 can be directly connected to the second redistribution layer 40 via the through silicon via (TSV) or further connected to the substrate 50 through the second redistribution layer 40.

Figure 4:
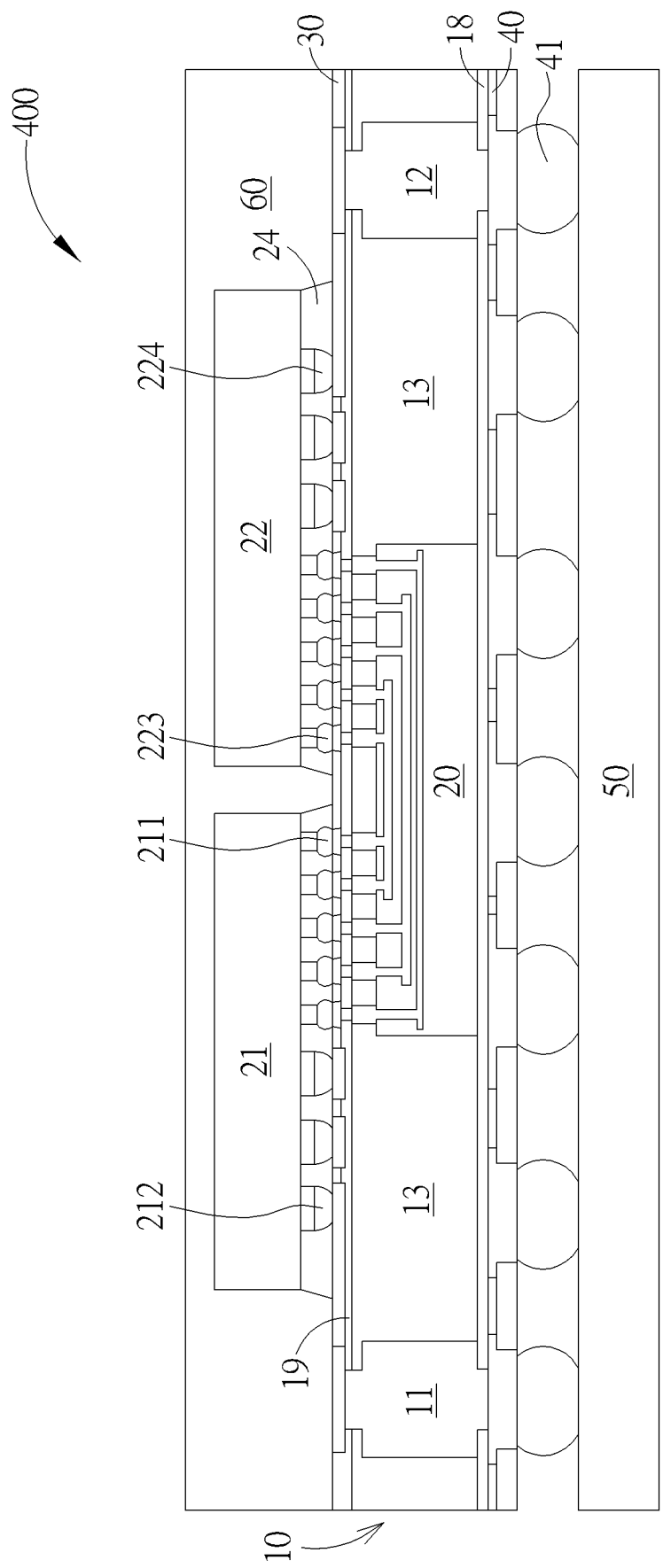
FIG. 4 is an illustration showing cross sectional view of a fourth embodiment of the chip package structure using silicon interposer as interconnection bridge according to the invention.

Please refer to FIG. 4. The chip package structure 400 in a fourth embodiment in FIG. 4 has substantially the same structure as the aforementioned chip package structures 100, 200, 300, in which same component is designated with the same number. A protective molding layer 60 can be further disposed on the top surface 19 of the fan-out package 10 and covers the first semiconductor die 21 and the second semiconductor die 22 for providing protection for the dies.

The chip package structure according to the embodiment of the invention lifts multi-dies above the fan-out molding package where at least two dies from the multi-dies are hybrid bump design structure which has both fine pitch and wide pitch design. The premade Si interposer is used as interconnection bridge embedded under the multi-die space for fine pitch high I/O interconnection between dies. The first RDL and the second RDL are further disposed on the top side and the bottom side of the fan-out molding package, further providing connection for the multi-dies to the substrate via the connection routing inside the fan-out molding package. The partial Si interposer interconnection bridge allows easier multi-die integration or system in package (SiP) and the shortest connection route also improves the signal/consumption performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chip package structure using silicon interposer as interconnection bridge, comprising:
   a fan-out package comprising an interconnection bridge, a first connection wiring, and a second connection wiring, the interconnection bridge embedded and packaged in a molding layer, the fan-out package having a bottom surface and a top surface opposite with each other; and
   a first semiconductor die and a second semiconductor die disposed and adjacent to each other on the top surface of the fan-out package, the first semiconductor die comprising a plurality of first contacts and a plurality of second contacts, the second semiconductor die comprising a plurality of third contacts and a plurality of fourth contacts;
   wherein the interconnection bridge is disposed under the plurality of first contacts of the first semiconductor die and the plurality of third contacts of the second semiconductor die where the plurality of first contacts form a plurality of inter-chip connections with the plurality of third contacts through the interconnection bridge;
   wherein the fan-out package is disposed on a substrate via the bottom surface, and the plurality of second contacts and the plurality of fourth contacts are electrically connected to the substrate respectively through the first connection wiring and the second connection wiring.

2. The chip package structure of claim 1, further comprising a first redistribution layer disposed on the top surface of the fan-out package, the first semiconductor die and the second semiconductor die disposed on the first redistribution layer, the plurality of second contacts and the plurality of fourth contacts respectively connected to the first connection wiring and the second connection wiring through the first redistribution layer.

3. The chip package structure of claim 1, further comprising a second redistribution layer disposed between the bottom surface of the fan-out package and the substrate, the second redistribution layer comprising a plurality of contact pads, the plurality of second contacts and the plurality of fourth contacts electrically connected to the substrate through the plurality of contact pads and respectively through the first connection wiring and the second connection wiring.

4. The chip package structure of claim 3, wherein each of the first connection wiring and the second connection wiring is a copper pillar or a through molding via (TMV) embedded and packaged in the molding layer.

5. The chip package structure of claim 3, wherein the interconnection bridge further electrically connects the substrate with at least part of the plurality of first contacts and at least part of the plurality of third contacts using through silicon vias (TSVs).

6. The chip package structure of claim 1, wherein the interconnection bridge is a silicon interposer and disposed partially in the molding layer, the silicon interposer is pre-made by silicon procedure before molding.

7. The chip package structure of claim 6, wherein the minimum line width/line pitch ratio of the interconnection bridge is no greater than 1/1 micrometer.

8. The chip package structure of claim 1, wherein the plurality of first contacts of the first semiconductor die and the plurality of third contacts of the second semiconductor die are fine pitch signal contacts, the pitch of the plurality of first contacts and the plurality of third contacts is no greater than 30 micrometers.

9. The chip package structure of claim 1, wherein the plurality of second contacts of the first semiconductor die and the plurality of fourth contacts of the second semiconductor die are wide pitch power contacts or grounding contacts, the pitch of the plurality of second contacts and the plurality of fourth contacts is greater than 30 micrometers.

10. The chip package structure of claim 1, wherein a protective molding layer is further disposed on the top surface of the fan-out package and covering the first semiconductor die and the second semiconductor die.

\* \* \* \* \*